United States Patent
Zhang

(10) Patent No.: US 11,843,390 B2
(45) Date of Patent: Dec. 12, 2023

(54) SYSTEM AND METHOD FOR DIGITAL-TO-ANALOG CONVERTER WITH SWITCHED RESISTOR NETWORKS

(71) Applicant: TEXAS INSTRUMENTS INCORPORATED, Dallas, TX (US)

(72) Inventor: Jun Zhang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/179,428

(22) Filed: Mar. 7, 2023

(65) Prior Publication Data

US 2023/0208426 A1 Jun. 29, 2023

Related U.S. Application Data

(63) Continuation of application No. 17/537,599, filed on Nov. 30, 2021, now Pat. No. 11,601,132, which is a continuation of application No. 16/950,343, filed on Nov. 17, 2020, now Pat. No. 11,190,200, which is a continuation of application No. 16/445,560, filed on Jun. 19, 2019, now Pat. No. 10,840,930, which is a continuation of application No. 15/986,084, filed on May 22, 2018, now Pat. No. 10,374,622, which is a continuation of application No. PCT/CN2018/071475, filed on Jan. 5, 2018.

(51) Int. Cl.
| | |
|---|---|
| H03M 1/06 | (2006.01) |
| H03M 1/68 | (2006.01) |
| H03M 1/80 | (2006.01) |
| H03M 1/78 | (2006.01) |
| H03M 1/76 | (2006.01) |
| H03M 7/16 | (2006.01) |

(52) U.S. Cl.
CPC ........... *H03M 1/0607* (2013.01); *H03M 1/68* (2013.01); *H03M 1/765* (2013.01); *H03M 1/785* (2013.01); *H03M 1/808* (2013.01); *H03M 7/16* (2013.01)

(58) Field of Classification Search
CPC ...... H03M 1/0607; H03M 1/68; H03M 1/765; H03M 1/808; H03M 1/875
USPC ......................................... 341/118, 144, 172
See application file for complete search history.

(56) References Cited

U.S. PATENT DOCUMENTS

| | | |
|---|---|---|
| 6,304,205 B1 | 10/2001 | Rezvani et al. |
| 6,975,261 B1 | 12/2005 | Isham |
| 7,250,890 B1 | 7/2007 | Wong |

(Continued)

FOREIGN PATENT DOCUMENTS

| | | |
|---|---|---|
| CN | 101471668 A | 7/2009 |
| CN | 101771415 A | 7/2010 |

(Continued)

*Primary Examiner* — Peguy Jean Pierre
(74) *Attorney, Agent, or Firm* — Brian D. Graham; Frank D. Cimino

(57) ABSTRACT

A digital-to-analog converter for generating an analog output voltage in response to a digital value comprising a plurality of bits, the converter including: (i) a first switched resistor network having a first configuration and for converting a first input differential signal into a first analog output in response to a first set of bits in the plurality of bits; and (ii) a second switched resistor network, coupled to the first switched resistor network, having a second configuration, differing from the first configuration, and for converting a second input differential signal into a second analog output in response to a second set of bits in the plurality of bits.

20 Claims, 10 Drawing Sheets

(56) References Cited

U.S. PATENT DOCUMENTS

| | | |
|---|---|---|
| 7,501,970 B2 | 3/2009 | Trifonov et al. |
| 7,884,783 B2 | 2/2011 | Choi |
| 8,766,841 B2 | 7/2014 | Mallinson |
| 8,884,799 B2 | 11/2014 | Price et al. |
| 8,947,282 B1 | 2/2015 | Fuks et al. |
| 2004/0257254 A1 | 12/2004 | Jiang et al. |
| 2007/0164887 A1 | 7/2007 | Truong et al. |

FOREIGN PATENT DOCUMENTS

| | | |
|---|---|---|
| CN | 102075192 A | 5/2011 |
| CN | 107342769 A | 11/2017 |

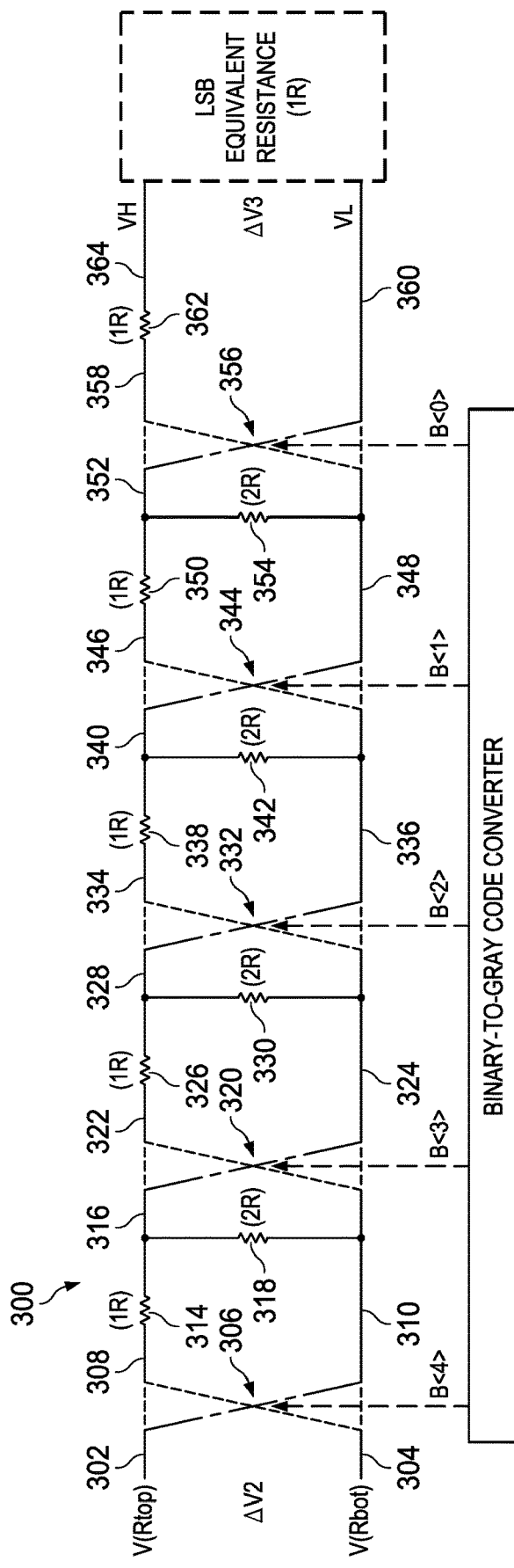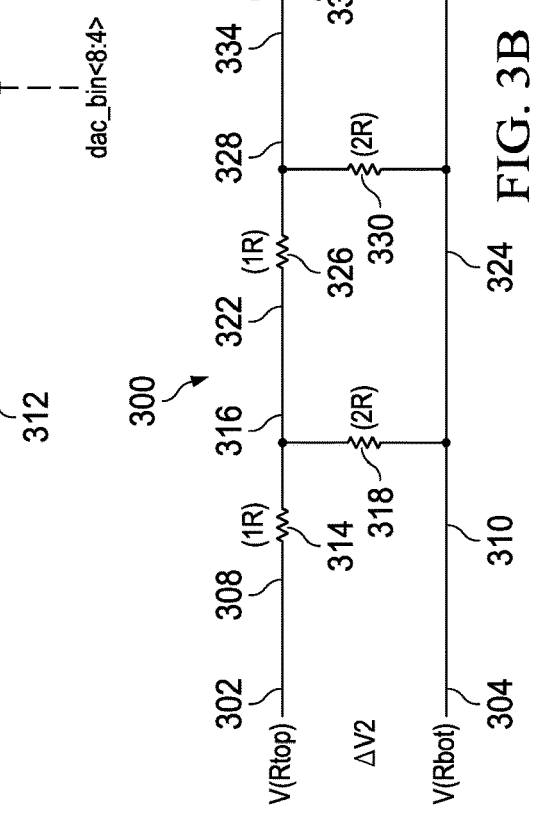
FIG. 3A
FIG. 3B

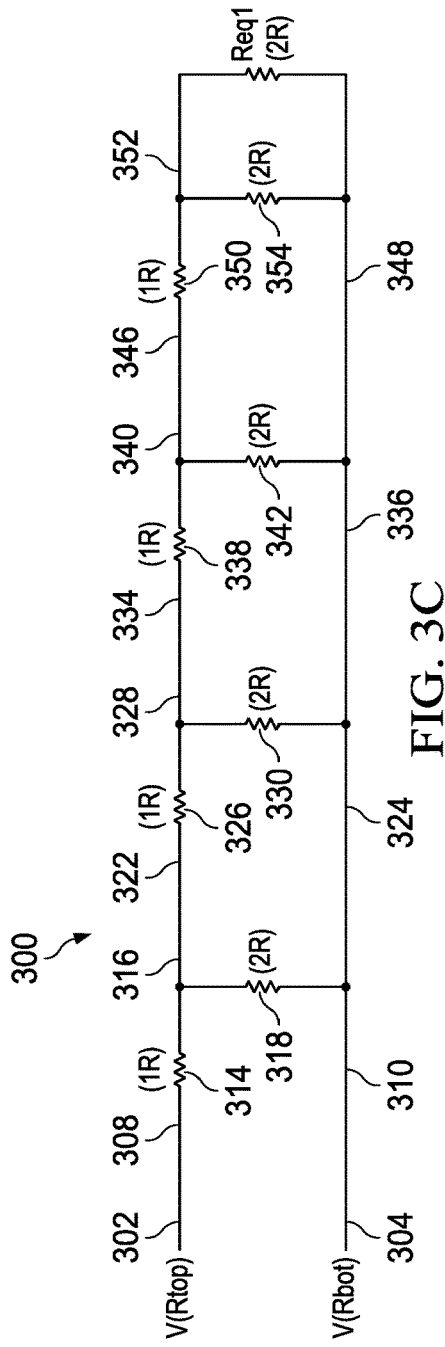
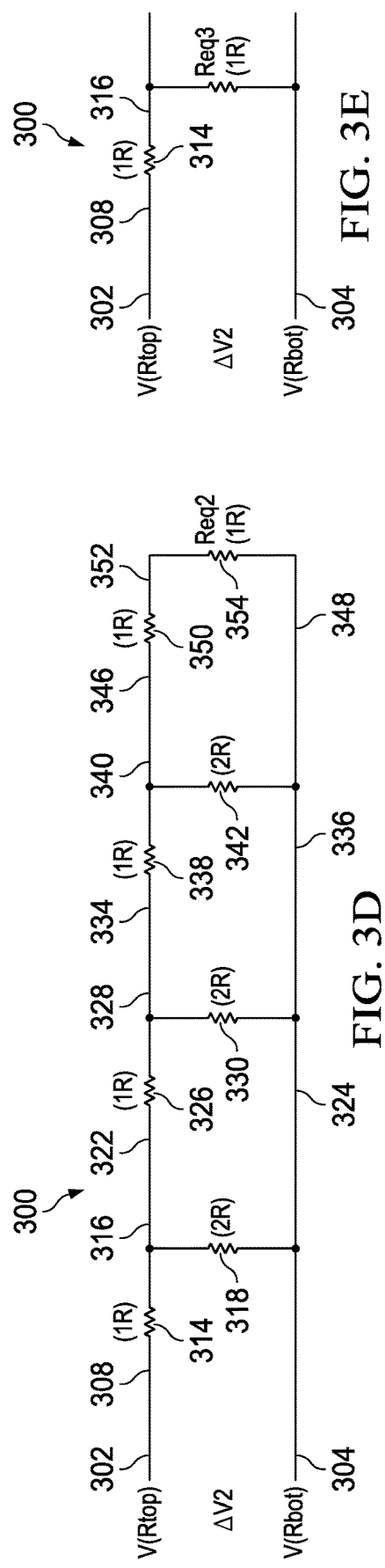
FIG. 3C
FIG. 3D
FIG. 3E

SYSTEM AND METHOD FOR DIGITAL-TO-ANALOG CONVERTER WITH SWITCHED RESISTOR NETWORKS

CROSS-REFERENCE TO RELATED APPLICATIONS

This application is a continuation of U.S. patent application Ser. No. 17/537,599 filed Nov. 30, 2021, which is a continuation of U.S. patent application Ser. No. 16/950,343, filed on Nov. 17, 2020, now U.S. Pat. No. 11,190,200, which is a continuation of U.S. patent application Ser. No. 16/445,560, filed on Jun. 19, 2019, now U.S. Pat. No. 10,840,930, which is a continuation of U.S. patent application Ser. No. 15/986,084, filed on May 22, 2018, now U.S. Pat. No. 10,374,622, which is a continuation of PCT Application No. PCT/CN2018/071475, filed on Jan. 5, 2018, the entire disclosure of each of which is incorporated herein by reference.

BACKGROUND

The preferred embodiments relate to digital-to-analog converters and systems including such convertors.

A digital-to-analog converter ("DAC") is a device or configuration that receives a digital input and provides an output voltage proportional to the value of the digital input. The digital value may follow standard binary representation or Gray code values, in which each successive value is represented by only a single bit change versus the value that precedes it. There are various DAC architectures currently used in the art, and selection of a particular architecture may depend on the application and with a view to certain performance and design metrics, such as power consumption, speed, glitch magnitude and energy, the area required to implement the device, and so forth.

Thus, while prior approaches have been workable in some applications, the present inventor seeks to improve upon the prior art, as further detailed below.

SUMMARY

In an embodiment, there is a digital-to-analog converter for generating an analog output voltage in response to a digital value comprising a plurality of bits, the converter comprising: (i) a first switched resistor network having a first configuration and for converting a first input differential signal into a first analog output in response to a first set of bits in the plurality of bits; and (ii) a second switched resistor network, coupled to the first switched resistor network, having a second configuration, differing from the first configuration, and for converting a second input differential signal into a second analog output in response to a second set of bits in the plurality of bits.

Numerous other inventive aspects are also disclosed and claimed.

BRIEF DESCRIPTION OF THE SEVERAL VIEWS OF THE DRAWING

FIG. 3A illustrates an electrical block and schematic diagram of the ISB stage of the system from FIG. 1.

FIG. 3B illustrates the ISB stage of FIG. 3A with switch positions in response to an ISB Gray code of 00000.

FIG. 3C illustrates the ISB stage of FIG. 3B with an equivalent resistance for the last sub-stage.

FIG. 3D illustrates the ISB stage of FIG. 3B with an equivalent resistance for the last two sub-stages.

FIG. 3E illustrates the ISB stage of FIG. 3B with an equivalent resistance for all sub-stages.

DETAILED DESCRIPTION

Figure 1:
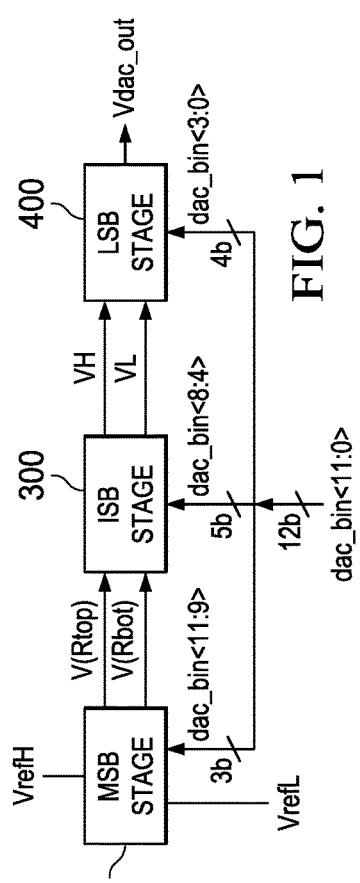
FIG. 1 illustrates an electrical and functional block diagram of a digital-to-analog converter (DAC) system according to a preferred embodiment.

FIG. 1 illustrates an electrical and functional block diagram of a digital-to-analog converter (DAC) system 100, according to a preferred embodiment. By way of introduction, system 100 converts a digital binary value dac_bin to a proportional analog output voltage Vdac_out, where in the example of FIG. 1 (and later Figures) dac_bin has a total of 12 bits—hence, shown by typical convention as dac_bin<11:0>. The use of 12 bits is by way of example, as various inventive concepts may be applied to other number of binary values. In that example, therefore, for dac_bin<11:0>=000000000000, an analog signal of Vdac_out will be relatively low (e.g., equal to or approaching a relatively low supply voltage, such as ground), while for dac_bin<11:0>=111111111111, an analog signal of Vdac_out will be relatively high (e.g., equal to or approaching a high supply voltage for system 200).

In a preferred embodiment, system 100 includes at least two stages, and preferably in one preferred embodiment three different stages, each responsive to a subset of the digital binary value dac_bin. As illustrated in FIG. 1, a three stage preferred embodiment includes: (i) a most significant bits (MSB) stage 200; (ii) an intermediate significant bits (ISB) stage 300; and (iv) a least significant bits (LSB) stage 400. MSB stage 200 is biased between voltage rails VrefH and VrefL and receives the MSBs of dac_bin<11:0>, where in the example illustrated the number of MSBs equals three. In response to those (e.g., three) MSBs dac_bin<11:9>, MSB stage 200 outputs different rail signals V(Rtop) and V(Rbot) to ISB stage 300, where the magnitude of V(Rtop) and V(Rbot) is proportional to the digital value of dac_bin<11:9>. ISB stage 300 is therefore biased between voltage rails V(Rtop) and V(Rbot) and receives the ISBs of dac_bin<11:0>, where in the example illustrates the number of ISBs so received equals five. In response to those (e.g., five) ISBs dac_bin<8:4>, ISB stage 300 outputs different rail signals VH and VL to LSB stage 400, where the magnitude of VH and VL is proportional to the digital value of dac_bin<8:4>, and further proportional therefore to the single MSB stage 200 preceding ISB stage 300. LSB stage 400 is therefore biased between voltage rails VH and VL and receives the LSBs of dac_bin<11:0>, where in the example illustrates the number of ISBs so received equals four. In response to those (e.g., four) LSBs dac_bin<3:0>, LSB stage 400 outputs the system output voltage Vdac_out, which will be proportional to the digital value of dac_bin<3:0>, and further proportional therefore to the two stages, namely MSB stage 200 and ISB stage 300, preceding LSB stage 400. Each of the three stages is further detailed below.

Figure 2:
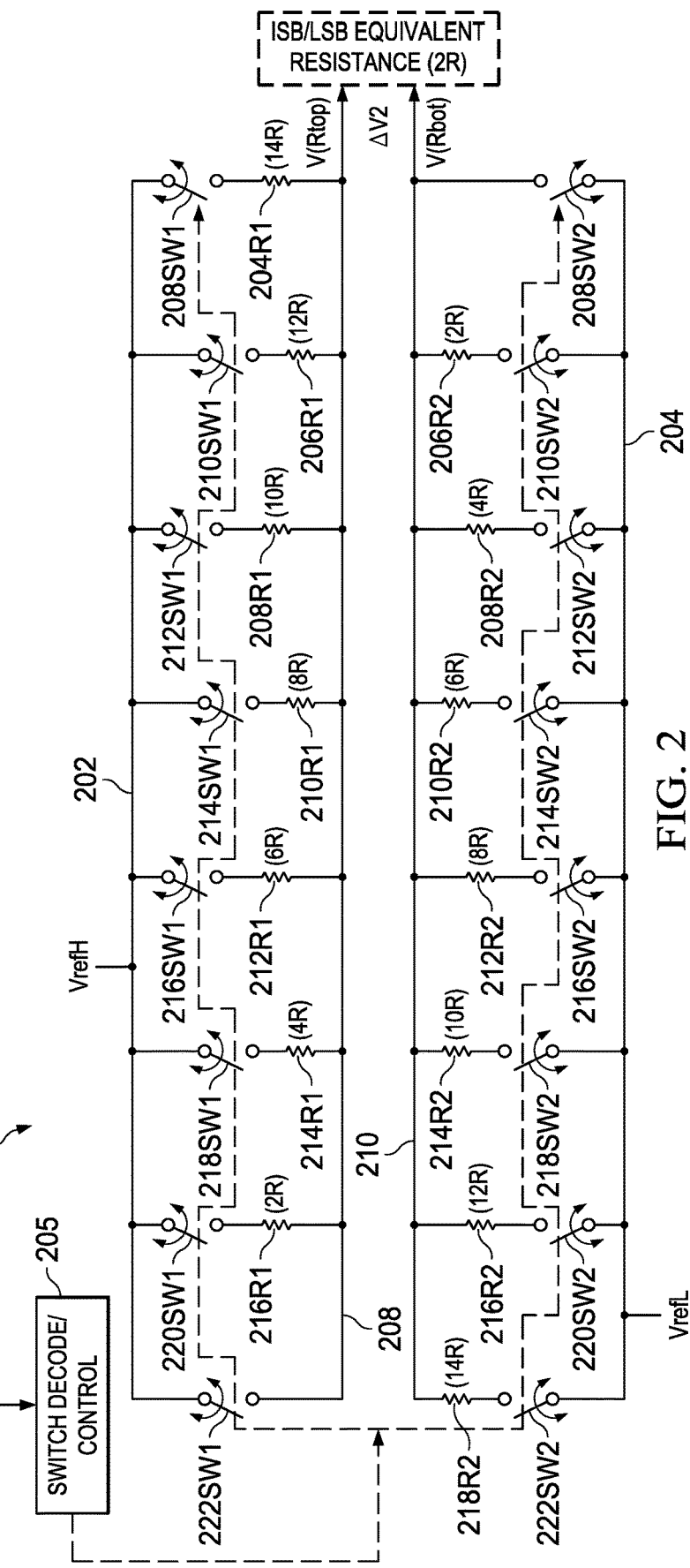
FIG. 2 illustrates an electrical block and schematic diagram of the MSB stage of the system from FIG. 1.

FIG. 2 illustrates an electrical block and schematic diagram of MSB stage 200 in greater detail. Each of the voltage rails VrefH and VrefL is connected to a respective node 202 and 204, and a switch decode/control block 205 receives the MSBs, namely, dac_bin<11:9>. As further appreciated below, stage 200 includes a number of switches, where each switch is preferably implemented in a same form, such as via one or more transistors, or the like. The opening and closing of each switch is in response to a control signal from switch decode/control block 205, as shown generally by way of dashed arrows. As further detailed below, the selective closing of switches is preferably to close only one switch at a time in the set of eight switches connected to node 202 and concurrently only one switch in the set of eight switches connected to node 204. As also appreciated below, stage 200 includes a number of resistors, so the selective closing of switches effectively changes the overall realized (or realizable) equivalent resistance of stage 200 as a whole, thereby changing the stage dividing effect as between the voltage rails VrefH and VrefL. To further appreciate the selectability or changing effective resistance of stage 200, note that nodes 208 and 210 also are loaded by an equivalent resistance from the ISB stage 300 and LSB stage 400 driven by those nodes, where as detailed below the resistance of that stage is twice a unit resistance, indicated therefore in FIG. 2 as a resistance of 2R.

In connection with node 202, a first terminal of seven evenly-numbered switches 208SW1 through 220SW1 is connected to node 202, and a second terminal of those seven switches is connected to a first terminal of a respective one of evenly-numbered resistors 204R1 through 216R1, where the second terminal of each of resistors 204R1 through 216R1 is connected to a node 208. A first node of an eighth switch 222SW1 is connected to node 202, and a second node of switch 222SW1 is connected to node 208. Node 208 also provides the above-introduced rail voltage, V(Rtop). Note that resistance values of the resistors in stage 200 (and in later stages) are described relative to a unit resistance 1R, meaning each resistor has an integer multiple resistance of a nominal unit value, where for example that nominal value can be 20 kΩ, in which case the intent is that a resistor of resistance 1R has that same resistance of 20 kΩ, a resistor of resistance 2R has twice that resistance, that is, of 40 kΩ, and so forth. Note also that resistance value will depend on total resistance, drive current, and voltage reference, so by way of example a 1R unit resistance could be in the 1 kΩ to 40 kΩ range. With this explanation, in the illustrated preferred embodiment, the multiple unit resistance of each of the seven resistors having a terminal connected to node 208 are as shown in the following Table 1:

TABLE 1

| Resistor | Unit resistance |
| --- | --- |
| 204R1 | 14R |
| 206R1 | 12R |
| 208R1 | 10R |
| 210R1 | 8R |
| 212R1 | 6R |
| 214R1 | 4R |
| 216R1 | 2R |

In connection with node 204, a first terminal of seven evenly-numbered switches 210SW2 through 222SW2 is connected to node 204, and a second terminal of those seven switches is connected to a first terminal of a respective one of evenly-numbered resistors 206R2 through 218R2, where the second terminal of each of resistors 206R2 through 218R2 is connected to a node 210. A first node of an eighth switch 208SW2 is connected to node 204, and a second node of switch 208SW2 is connected to node 210. Node 210 also provides the above-introduced rail voltage, V(Rbot). Further, having introduced the unit resistance 1R, in the illustrated preferred embodiment, the multiple unit resistance of each of the seven resistors having a terminal connected to node 210 are as shown in the following Table 2:

TABLE 2

| Resistor | Unit resistance |
| --- | --- |
| 206R2 | 2R |
| 208R2 | 4R |
| 210R2 | 6R |
| 212R2 | 8R |
| 214R2 | 10R |
| 216R2 | 12R |
| 218R2 | 14R |

The operation of MSB stage 200 is now described in greater detail. MSBs dac_bin<11:9> are input to block 205, and in response, either or both of voltages V(Rtop) and V(Rbot) are adjusted to provide a second differential ΔV2, which is proportional to the value of the MSBs and a function of the differential voltage ΔV1 between VrefH and VrefL. As introduced above, the three MSBs cause a simultaneous closing of only one switch in the set of switches connected to node 202 and one switch in the set of switches connected to node 204 and, thus, each resistor in a first set of resistors (204R1 through 216R1) is switchably selectable to connect between the node 202 and node 208, and each resistor in a second set of resistors (206R2 through 218R2) is switchably selectable to connect between node 204 and node 210. Note now that the first three integers used in reference numbering those switches is intended to indicate that like numbered switches are closed at a same time—for example, if the MSBs cause switch 208SW1 to close, then those same MSBs cause switch 208SW2 to simultaneously close. Continuing with that example in which switch 208SW1 closes (at the same time as switch 208SW2 closing), therefore, one skilled in the art will appreciate that VrefH is thereby connected through resistor 204R1, having a resistance of 14R, to node 208, thereby creating a series connection of the 14R from resistor 204R1 to the ISB/LSB equivalent resistance of 2R, for a total series resistance of 16R, and as a result of voltage division, 7/8 of VrefH is across the 14R resistance of resistor 204R1 (i.e., 14R/16R=7/8), while the remaining ⅛ of VrefH is across the 2R equivalent resistance of the ISB/LSB stages (i.e., 2R/16R=⅛) and is therefore output as V(Rtop). Also with the example where switch 208SW2 closes (at the same time as switch 208SW1 closing), VrefL is thereby connected directly to node 210, in which case the voltage at node 210 equals VrefL which, as a lower rail voltage, may equal ground. Having provided one example of the concurrent like-numbered switches closing and the resultant voltages at V(Rtop) and V(Rbot), the following Table 3 illustrates all possibilities of the three MSBs, and the corresponding switch pair closed by decode/control by block 205 in response to those MSBs as well as the resultant voltages at V(Rtop) and V(Rbot), where those voltages are shown as VrefH, VrefL, or in proportion to the differential voltage of VrefH−VrefL=ΔV1:

TABLE 3

| dac_bin<11:9> | Switch pair closed | V(Rtop) | V(Rbot) |
|---|---|---|---|
| 000 | 208 | [(1/8)*ΔV1] + VrefL | VrefL |
| 001 | 210 | [(2/8)*ΔV1] + VrefL | [(1/8)*ΔV1] + VrefL |
| 010 | 212 | [(3/8)*ΔV1] + VrefL | [(2/8)*ΔV1] + VrefL |
| 011 | 214 | [(4/8)*ΔV1] + VrefL | [(3/8)*ΔV1] + VrefL |
| 100 | 216 | [(5/8)*ΔV1] + VrefL | [(4/8)*ΔV1] + VrefL |
| 101 | 218 | [(6/8)*ΔV1] + VrefL | [(5/8)*ΔV1] + VrefL |
| 110 | 220 | [(7/8)*ΔV1] + VrefL | [(6/8)*ΔV1]] + VrefL |
| 111 | 222 | [(8/8)*ΔV1] + VrefL | [(7/8)*ΔV1] + VrefL |

Given the preceding and the values in Table 3, it may be generally observed that at the MSB maximum (i.e., MSB=dac_bin<12:9>=111), V(Rtop) is the highest achievable output from the eight (i.e., 3²=8) combinations of MSBs, that is, V(Rtop) equals the full differential of ΔV1 (i.e., VrefH−VrefL)+VrefL, while V(Rbot) is [(⅞)*ΔV1]+VrefL, that is, (⅛)*ΔV1 below V(top). Moreover, with each successive decrement of the MSBs (e.g., 111, 110, 101, . . . ), then each of nodes 208 and 210 decreases by (⅛)*ΔV1. Thus, for a change in the MSBs, the differential between V(Rtop) and V(Rbot) remains constant while each respective rail V(Rtop) and V(Rbot) decreases by (⅛)*ΔV1 for each sequential decrement. Moreover, when the combined MSBs reach a minimum (i.e., MSB=dac_bin<12:9>=000), V(Rbot) is the lowest achievable output from the eight combinations of MSBs, that is, V(Rbot) equals RrefL, and again V(Rtop) is ⅛*ΔV1 higher than V(Rbot). In all instances, the adjustable rail voltages, with a common voltage differential, are thereby presented as ΔV2 to the next stage, that is, to ISB stage 300, as further explored below.

FIG. 3 illustrates an electrical block and schematic diagram of ISB stage 300 in greater detail. By way of introduction, stage 300 includes an R-2R resistor ladder, which in some prior implementations is the sole approach for converting a digital signal to an analog signal—in this regard, the configuration is referred to as a ladder for including multiple sub-stages, whereby each sub-stage includes a first and second resistance, where either the intermediate node between the two or the terminal end of the second resistance provides a switchable input to the next sub-stage. Indeed, as described later, a preferred embodiment of multiple stages results in considerable improvement over such an approach, particularly in a reduction in the resistance values needed for the ADC conversion. Also by way of introduction, additional information with respect to an ADC R-2R resistor ladder may be found in U.S. Pat. No. 4,591,826, issued May 27, 1986 to Seiler, which is fully incorporated herein by reference.

ISB stage 300 receives the voltage V(Rtop) as connected to a node 302 and the voltage V(Rbot) as connected to a node 304. A double pole, double throw (DPDT) switch 306 is connected from nodes 302, 304, to switch between those nodes and a respective pair of nodes 308 and 310, where switch 306 is shown by dashed lines; hence, switch 306 in a first position connects node 302 to node 308, while concurrently connecting node 304 to node 310, and switch 306 in a second position connects node 302 to node 310, while concurrently connecting node 304 to node 308. Control of switch 306 to either of these positions is in response to a Gray code bit B<4>. Further in this regard, system 300 includes a binary-to-Gray code converter 312 which receives the five ISBs dac_bin<8:4> and converts those to an equivalent five bit Gray code B<4:0>, where Gray codes are known to provide an increasing sequence of bits, where for each incremental value only a single bit changes in the code as compared to the bit code that immediately preceded it. Further in this regard, each bit in the Gray code B<4:0> operates a respective switch in stage 300 as further detailed below, so the nature of Gray codes permitting only one bit to switch state at a time will correspondingly cause only one switch in stage 300 to change state at a time, thereby improving performance (e.g., reducing switching-induced node and power consumption). Accordingly, bit B<4> controls switch 306 as described above, and further such that when B<4>=0, the above-described first position is achieved, whereas when B<4>=1, the above-described second position is achieved.

Continuing with the devices and connections in stage 300, node 308 also connects to a first terminal of a resistor 314, with a unit resistance of 1R and having a second terminal connected to a node 316. Node 316 also connects to a first terminal of a resistor 318, with a unit resistance of 2R and having a second terminal connected to node 310. The relationship of the 1R resistance of resistor 314 to the 2R resistance of resistor 318 aligns with the reference to the configuration as an R-2R configuration. A DPDT switch 320, controlled by Gray code bit B<3>, is connected from nodes 316, 310, to switch between those nodes and a respective pair of nodes 322 and 324. Node 322 also connects to a first terminal of a resistor 326, with a unit resistance of 1R and having a second terminal connected to a node 328. Node 328 also connects to a first terminal of a resistor 330, with a unit resistance of 2R and having a second terminal connected to node 324. A DPDT switch 332, controlled by Gray code bit B<2>, is connected from nodes 328, 324, to switch between those nodes and a respective pair of nodes 334 and 336. Node 334 also connects to a first terminal of a resistor 338, with a unit resistance of 1R and having a second terminal connected to a node 340. Node 340 also connects to a first terminal of a resistor 342, with a unit resistance of 2R and having a second terminal connected to node 336. A DPDT switch 344, controlled by Gray code bit B<1>, is connected from nodes 340, 336, to switch between those nodes and a respective pair of nodes 346 and 348. Node 346 also connects to a first terminal of a resistor 350, with a unit resistance of 1R and having a second terminal connected to a node 352. Node 352 also connects to a first terminal of a resistor 354, with a unit resistance of 2R and having a second terminal connected to node 348. A DPDT switch 344, controlled by Gray code bit B<0>, is connected from nodes 352, 348, to switch between those nodes and a respective pair of nodes 358 and 360. Node 358 also connects to a first terminal of a resistor 362, with a unit resistance of 1R and having a second terminal connected to a node 364. Lastly, nodes 364 and 360 provide respective rail voltages VH and VL to LSB stage 400 (see FIGS. 1 and 4A), and as illustrated in FIG. 3 that stage provides an equivalent resistance load of 1R to MSB stage 300.

The operation of ISB stage 300 is now described in additional detail. As introduced above, as the ISBs (e.g., dac_bin<8:4>) are input to system 100, they are converted by converter 312 to a Gray Code B<4:0>, with that conversion shown in the first two columns of the following Table 4:

TABLE 4

| dac_bin<8:4> | B<4:0> | VH | VL |
|---|---|---|---|
| 00000 | 00000 | [(1/32)*ΔV2] + V(Rbot) | V(Rbot) |
| 00001 | 00001 | [(1/32)*ΔV2] + V(Rbot) | [(2/32)*ΔV2] + V(Rbot) |
| 00010 | 00011 | [(3/32)*ΔV2] + V(Rbot) | [(2/32)*ΔV2] + V(Rbot) |
| 00011 | 00010 | [(3/32)*ΔV2] + V(Rbot) | [(4/32)*ΔV2] + V(Rbot) |
| 00100 | 00110 | [(5/32)*ΔV2] + V(Rbot) | [(4/32)*ΔV2] + V(Rbot) |
| 00101 | 00111 | [(5/32)*ΔV2] + V(Rbot) | [(6/32)*ΔV2] + V(Rbot) |
| 00110 | 00101 | [(7/32)*ΔV2] + V(Rbot) | [(6/32)*ΔV2] + V(Rbot) |
| 00111 | 00100 | [(7/32)*ΔV2] + V(Rbot) | [(8/32)*ΔV2] + V(Rbot) |
| ... | ... | ... | ... |
| ... | ... | ... | ... |
| 11100 | 10010 | [(29/32)*ΔV2] + V(Rbot) | [(28/32)*ΔV2] + V(Rbot) |
| 11101 | 10011 | [(29/32)*ΔV2] + V(Rbot) | [(30/32)*ΔV2] + V(Rbot) |
| 11110 | 10001 | [(31/32)*ΔV2] + V(Rbot) | [(30/32)*ΔV2] + V(Rbot) |
| 11111 | 10000 | [(31/32)*ΔV2] + V(Rbot) | [(32/32)*ΔV2] + V(Rbot) |

The Table 4 left two columns thus illustrate the above-described nature of the Gray code, that is, as the five MSBs in the binary code dac_bin increment, a corresponding Gray code is provided and it only changes one bit at a time. For example, consider the increase of binary code dac_bin from 00011 to 00100. In the binary sense, all three of the lower significant bits in that sequence change; however, the corresponding Gray code conversion provides a sequence from 00010 to 00110, in which case only the third bit changes, namely, from 0 to 1. Moreover, from FIG. 3, that third bit is bit B<2>, so in this instance only switch 332 changes position, while the other four switches do not. Further, the switch change connects node 328 to node 336 and node 324 to node 334, thereby causing a change in the voltage division from stage 300, as will be further appreciated below.

The voltage division achieved by the various resistors in stage 300 and the selective change in node connectivity, by virtue of switches 306, 320, 332, 344, and 356, is now further described. By way of example, consider the instance where dac_bin<8:4>=00000 and, as shown in Table 4, likewise the corresponding Gray code B<4:0> therefore also=00000. In this case, each switch in FIG. 3A connects along what are shown as the horizontal dashed lines, thereby establishing a resistor ladder as shown in FIG. 3B, namely, with four sub-stages, meaning the combination of a 1R resistor connected to a 2R resistor, where the intermediate node between the resistors provides an output for a next sub-stage, and where the ladder essentially includes what can be characterized as a final, fifth sub-stage from the 1R resistance of resistor 362 and the 1R equivalent resistance from the LSB stage that is connected to nodes 364 and 360. In this configuration, the 1R resistance of resistor 362 and the 1R equivalent resistance of the LSB stage may be considered, from a circuit analysis standpoint an equivalent 2R total series resistance Req1, which therefore is in parallel with the 2R resistance of resistor 354, as shown in FIG. 3C. Continuing, therefore, the two same resistance values of 2R in parallel (i.e., of resistor 354 and equivalent resistance Req1) create an equivalent resistance Req2 of 1R between nodes 352 and 348, as shown in FIG. 3D. Similar to the analysis of FIG. 3A, therefore, again the far right end of the equivalent network has two series connected 1R resistances, here being resistor 350 and equivalent resistance Req2, connected in parallel with a 2R resistance, here resistor 342. From these observations, one skilled in the art should be able to readily confirm that such impedance equivalence can continue for each successive sub-stage, ultimately yielding the equivalent resistance shown in FIG. 3E. Specifically, FIG. 3E illustrates a final equivalent resistance diagram in which between the input rail voltages are connected a resistor 314 with a 1R resistance and a 1R equivalent resistance Req3, with one output node 316 between the two resistors and another output node 304 at the end of the two-resistor connection, thereby creating a differential output voltage across the 1R equivalent resistance Req3. Further, because the resistance of resistor 314 and equivalent resistance Req3 are equal (e.g., 1R), then a ½ input voltage divider is created, that is, the output voltage for this equivalent resistance is (½)*ΔV2.

Having demonstrated above that a singular sub-stage equivalent resistance of output=(½)*(input differential voltage), note that the same principle applies equally across each sub-stage in FIG. 3B (i.e., in response to dac_bin<8:4>=B<4:0>=00000). Thus, each stage, when switched to the configuration of 3B multiplies its input times ½, so the total of five stages produce a divider of $$\left(\frac{1}{2}\right)^5 = \frac{1}{32}.$$

Returning to Table 4, note then that the first data row therein, corresponding to the case of dac_bin<8:4>=B<4:0>=00000, thusly provides an upper rail output VH of [(1/32)*ΔV2]+V(Rbot); meanwhile, as readily seen by the connections of any of FIG. 3A through FIG. 3E, the same switched configuration directly connects V(Rbot) to VL, as also shown in the first data row of Table 4. Lastly, given the now-described example of the first row of Table 4 and FIGS. 3A through 3E, one skilled in the art may readily provide a comparable analysis for each other row by evaluating the realized equivalent resistance per sub-stage and the resultant voltage division achieved, thereby confirming the remaining indications in Table 4. In all instances, the adjustable rail voltages of VH and VL will have a common voltage differential of $(1/32)*\Delta V2$, but note that the DPDT switches permit in certain instance either VH>VL or VL>VH, and in any event that difference is thereby presented as $\Delta V3$ to the next stage, that is, to LSB stage 400, as further explored below.

Figure 4A:
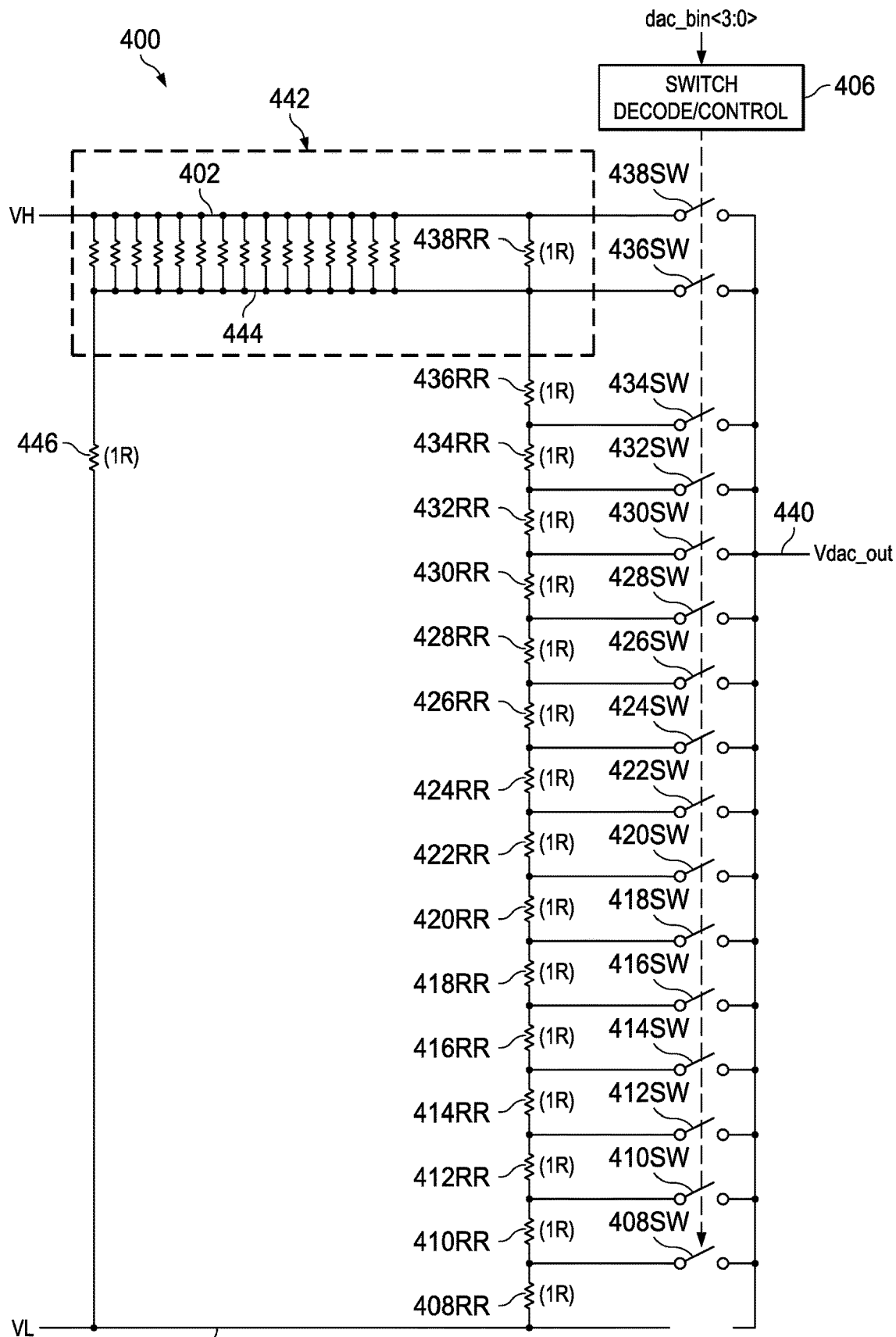
FIG. 4A illustrates an electrical block and schematic diagram of the LSB stage of the system from FIG. 1.

FIG. 4A illustrates an electrical block and schematic diagram of LSB stage 400 in greater detail. Each of the voltage rails VH and VL (from the output of ISB stage 300) is connected to a respective node 402 and 404, and a switch decode/control block 406 receives the LSBs, namely, dac_bin<3:0>. Like block 205 in stage 200, block 406 converts bits, here four LSB bits, into a control to selectively close one of sixteen evenly-numbered switches 408SW through 438SW at a time. Particularly, each of switches 408SW through 438SW has a first terminal connected to an output node 440 and a second terminal connected to a first terminal of a respective one of evenly-numbered 1R unit resistance resistors 408RR through 438RR, where resistors 408RR through 438RR form a series-string of resistors connected between node 402 and node 404. The second terminal of each of resistors 410RR through 438RR is connected to the first terminal of a respective resistor below it in the series connection of resistors 408RR through 438RR, where, for example, the second terminal of resistor 438R is connected to the first terminal of resistor 436RR, the second terminal of resistor 436R is connected to the first terminal of resistor 434RR, and so forth through, but the last series-connected resistor 408RR has its second terminal connected to node 404. Resistor 438RR is also one of sixteen 1R unit resistance resistors, all connected as part of a resistor set 442, each connected in parallel, that is, between node 402 and a node 444. Lastly, an additional resistor 446, having a single unit resistance 1R, is connected between node 444 and node 404.

The operation of LSB stage 400 is now described in additional detail. As introduced above, as the LSBs (e.g., dac_bin<3:0>) are input to system 100, they are converted to a control signal to close one of switches 408SW through 438SW at a time, with the selected closed switch, and the corresponding LSB bits that cause such closure, shown in the first two columns of the following Table 5:

TABLE 5

| dac_bin<3:0> | Switch closed | Vdac_out |
|---|---|---|
| 0000 | 408SW | [(1/16)*$\Delta$V3] + VL |
| 0001 | 410SW | [(2/16)*$\Delta$V3] + VL |
| 0010 | 412SW | [(3/16)*$\Delta$V3] + VL |
| 0011 | 414SW | [(4/16)*$\Delta$V3] + VL |
| 0100 | 416SW | [(5/16)*$\Delta$V3] + VL |
| 0101 | 418SW | [(6/16)*$\Delta$V3] + VL |
| 0110 | 420SW | [(7/16)*$\Delta$V3] + VL |
| 0111 | 422SW | [(8/16)*$\Delta$V3] + VL |
| 1000 | 424SW | [(9/16)*$\Delta$V3] + VL |
| 1001 | 426SW | [(10/16)*$\Delta$V3] + VL |
| 1010 | 428SW | [(11/16)*$\Delta$V3] + VL |
| 1011 | 430SW | [(12/16)*$\Delta$V3] + VL |

TABLE 5-continued

| dac_bin<3:0> | Switch closed | Vdac_out |
|---|---|---|
| 1100 | 432SW | [(13/16)*$\Delta$V3] + VL |
| 1101 | 434SW | [(14/16)*$\Delta$V3] + VL |
| 1110 | 436SW | [(15/16)*$\Delta$V3] + VL |
| 1111 | 438SW | [(16/16)*V$\Delta$3] + VL |

Figure 4B:
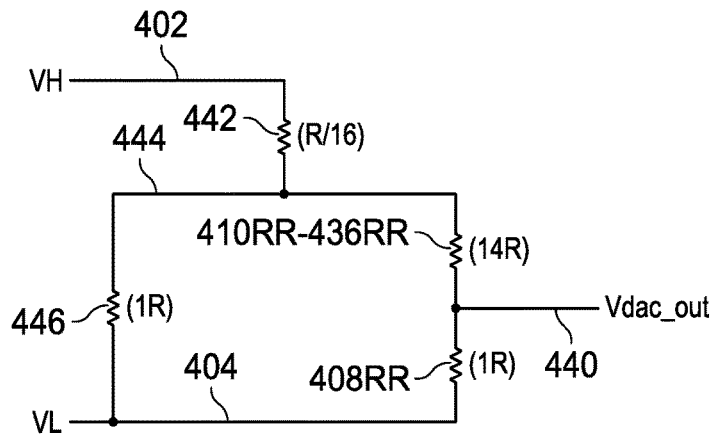
FIG. 4B illustrates an equivalent resistance of the LSB stage of FIG. 4A with switch positions in response to LSB sequence of 0000.

The Table 5 left two columns thus illustrate the change in the LSBs and the corresponding single selected switch that closes in response, and the third column indicates the resultant voltage division in response to that closed switch. That voltage division, achieved by the various resistors and switches in stage 400, is now further described. By way of example, consider the instance where dac_bin<0:0>=0000 and, as shown in Table 5, switch 408SW closes, so the effective resulting circuit may be as illustrated in FIG. 4B. Toward the top of the Figure, the equivalent resistance of the 16 parallel 1R unit resistance resistors in set 444 is shown, that is, R/16, connected between nodes 402 and 444. Beneath node 444 is the same single 1R unit resistance of resistor 446, and in parallel therewith are the 14 series connected 1R units resistors 410RR through 436RR having therefore a total resistance of 14R, further in series with the single 1R unit resistor 408RR. Lastly, note that output node 440, by virtue of the closed switch 408SW (see FIG. 4A) in the current example, is between the 14R resistance of 1R unit resistors 410RR through 436RR and the single 1R unit resistor 408RR.

Figure 4C:
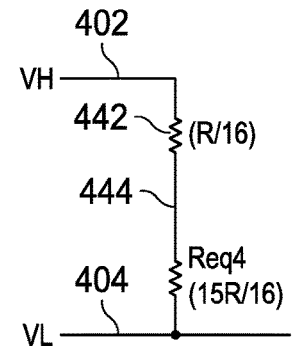
FIG. 4C illustrates an equivalent resistance of the LSB stage of FIG. 4A.

FIG. 4C illustrates the equivalent resistance of FIG. 4B, taking into account the connections between nodes 444 and 404. Specifically, between those nodes as shown in FIG. 4B are a parallel connection of a 1R resistance (from 446) with a series connection of a 15R resistance (from 408RR through 436RR). The resultant equivalent resistance Req4 from that parallel connection is as shown in the following Equation 1:

$$Req4 = \frac{R*15R}{R+15R} = \frac{15R^2}{16R} = \frac{15R}{16} \qquad \text{Equation 1}$$

Accordingly, as shown in FIG. 4C, stage 400 reduces to an equivalent resistance of R/16 above node 444 and 15R/16 below node 444, that is, a voltage divider is created with [(1/16)*(VH−VL)]+VL above node 444 and [(15/16)*(VH−VL)]+VL below node 444. In addition, note that the lower [(15/16)*(VH−VL)]+VL is further divisible by the 15 resistors, and corresponding switches, below node 444 as shown in FIG. 4A. For example, therefore, if switch 408SW is closed, then the lower [(15/16)*(VH−VL)]+VL below node 444 is divided by the one out of fifteen resistors (i.e., resistor 408RR) connected by the closed switch to output node 444, providing a resultant output voltage as shown in the following Equation 2:

$$Vdac_{out} = \left[\frac{15(VH-VL)}{16}*\frac{1}{15}\right]+VL = \left[\frac{VH-VL=V\Delta3}{16}\right]+VL \qquad \text{Equation 2}$$

Hence, Equation 2 confirms the first data row entry in Table 15, that is, where dac_bin<3:0>=0000, switch 408SW closes and the output is the differential input divided by 16, plus VL. Moreover, one skilled in the art should now appreciate that as the LSBs (i.e., dac_bin<3:0>) increment, a next upper switch in the set of 16 switches, each connected to a respective series-connected resistor, closes, thereby connecting an additional ⅟15 resistance between node 404 and the output, thereby increasing the output by an additional (⅟16) *VΔ3, as shown in Table 5.

Also contemplated in connection with stage 400 of FIG. 4A are various alternatives. For example, while FIG. 4A illustrates a 16-bit voltage divider, other variations, such as powers of 2, may be implemented in alternative preferred embodiments. In the illustrated or such alternative instances, for an N-bit divider following the same general schematic as in FIG. 4A, the number of parallel resistors in set 444 is N, the number of switches is N, and the number series resistors between nodes 444 and 404 is N−1. In this manner, for example, an N=8 bit divider may be constructed, with 8 parallel resistors between nodes 402 and 444, 7 series resistors between nodes 444 and 404, and 8 switches, each connected from a respective first terminal of a resistor to an output node 440. As still another variation, note from Table 5 that the lowest voltage achievable is higher than VL (e.g., (⅟16)*VΔ3), as the configuration does not facilitate a connection directly from node 404 to node 440, so the lowest achievable output is the voltage across the bottom resistor 408RR (i.e., via switch 408SW) in the output resistor series string. Hence, in an alternative preferred embodiment, a switch may be added from node 404 to node 440, with the switch from node 402 to node 440 removed; in this configuration, the lowest achievable output will be VL, although as a tradeoff the highest achievable output will no longer by VH, in that no direct connection from node 402 to node 440 is thus achievable, so the highest such output voltage will be (¹⁵⁄16)*VΔ3, that is, the voltage across the N−1 resistors between node 444 and node 404.

Figure 5:
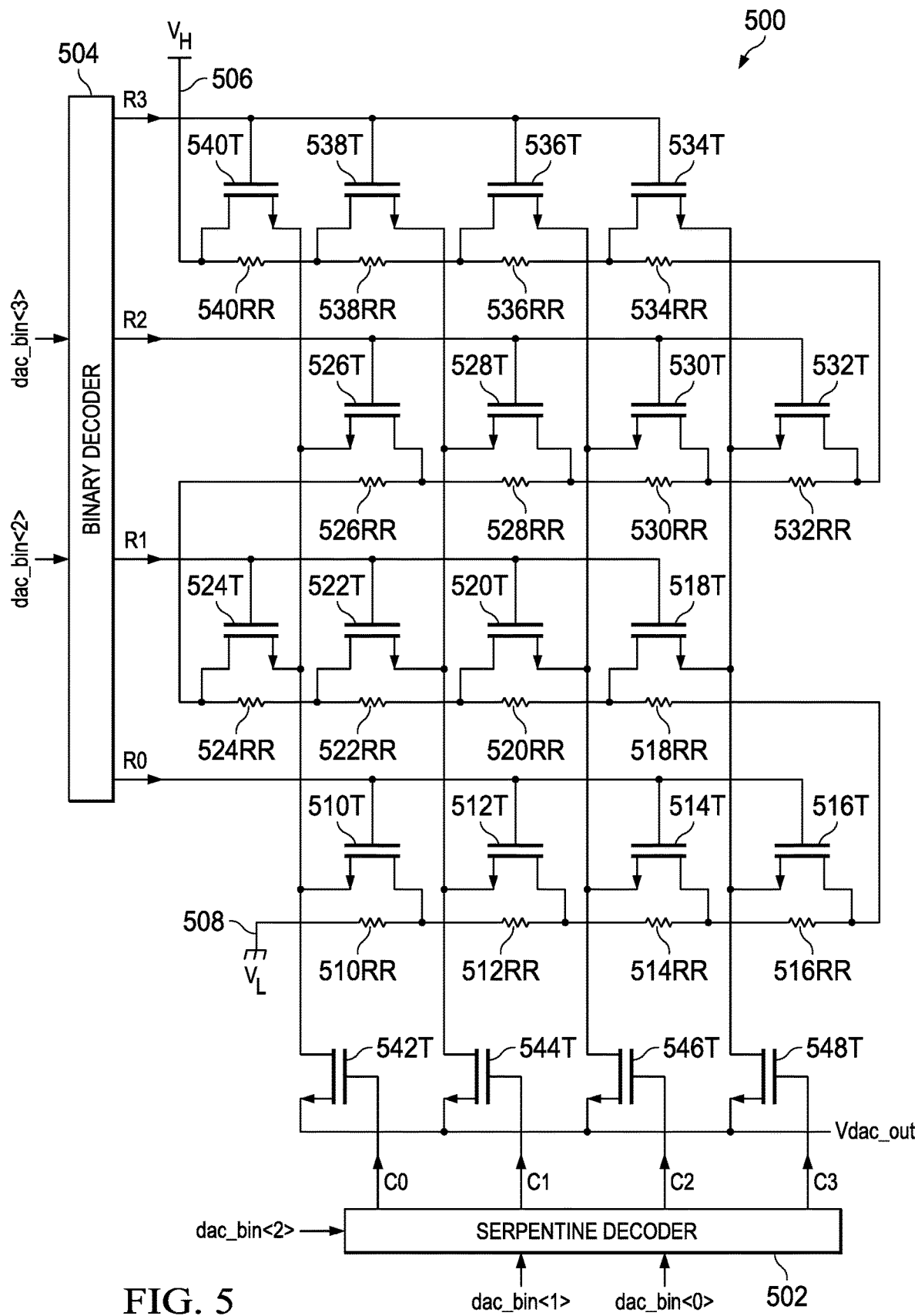
FIG. 5 illustrates an electrical block and schematic diagram of an alternative preferred embodiment of the LSB stage of the system from FIG. 1.

FIG. 5 illustrates an electrical block and schematic diagram of alternative preferred embodiment LSB stage 500 in greater detail, as may be substituted for LSB stage 400 of FIG. 4A. Specifically, it is recognized and contemplated that in stage 400 of FIG. 4A, one terminal of each of the 16 switches connects directly to output node 440. As a result, parasitic capacitance from such switches may cause speed limitations of a signal swing on that node as well as potential glitches in the output signal. Thus, LSB stage 500 provides an alternative in which such considerations may be improved, particularly for instances where the number of LSBs is beyond a design threshold (e.g., greater than four LSBs).

The LSBs of stage 500, namely, dac_bin<3:0>, are splits into two sets, one being the lesser significant of those bits and the other being the more significant of those bits. The lesser significant of the LSBs, namely, dac_bin<1:0>, are connected to what will be referred to herein as a serpentine decoder 502 which, as detailed later, is so named in that those bits are decoded to a pattern that in response to successive increments in dac_bin<1:0>, and further in response to dac_bin<2>, the output of decoder 502 is such that, instead of wrapping around from its maximum of 3 back to 0 as would a typical 2-bit binary decoder, it instead traces upward to its maximum, repeats that maximum and then decrements back to its minimum, repeats that, and returns again in the opposite direction (e.g., 0, 1, 2, 3, 3, 2, 1, 0, 0, 1, 2, . . . ), for reasons of addressing a serpentine array pattern as more apparent later. Further in this regard, therefore, for each 2—bit input to decoder 502, the 1 of 4 output of serpentine decoder 502 thereby selects a corresponding column C0 through C3. The more significant of the LSBs, namely, dac_bin<3:2>, are connected to a binary decoder 504, which operates in standard binary conversion so that in response to successive increments in dac_bin<3:2>, the output of binary encoder 504 merely increments upward to its maximum and then repeats from its minimum (e.g., 0, 1, 2, 3, 3, 0, 1, 2, 3, . . . ), also for reasons more apparent later. Further in this regard, therefore, for each 2-bit input, the 1 of 4 output of binary decoder 504 thereby selects a corresponding row R0 through R3.

Each of the voltage rails VH and VL (from the output of ISB stage 300) is connected to a respective node 506 and 508. Between nodes 508 and 506 is a series resistance string consisting of sixteen resistors evenly numbered 510RR through 540RR. A first terminal of each of resistors 510RR through 540RR, closer to node 506, is connected to a drain of a respective evenly numbered switching transistor 510T through 540T, and a source of each of switching transistor 510T through 540T is connected to one of four of columns C0 through C3, as shown in the following Table 6:

TABLE 5

| Column | Transistor source connected |
| --- | --- |
| C0 | 510T, 524T, 526T, 540T |
| C1 | 512T, 522T, 528T, 538T |
| C2 | 514T, 520T, 530T, 536T |
| C3 | 516T, 518T, 532T, 534T |

Moreover, each of switching transistors 510T through 540T has its gate connected to one of four of row R0 through R3, as shown in the following Table 6:

TABLE 6

| Row | Transistor source connected |
| --- | --- |
| R0 | 510T, 512T, 514T, 516T |
| R1 | 518T, 520T, 522T, 524T |
| R2 | 526T, 528T, 530T, 532T |
| R3 | 534T, 536T, 538T, 540T |

From Tables 5 and 6, also from FIG. 5, note therefore that the series resistor string of resistors 510RR through 540RR, and the respective transistor connected to each resistor, is connected in a serpentine fashion, that is, upon traversing along a row of resistors, for example from left to right, all coupled to respective transistors having gates controlled by a single row line, at the last column providing an end of one row, rather than wrapping around to the first column (e.g., left) of the next row, the pattern is serpentine so as to end at the column one of a row and then begin the next row at that same column. For example, consider the top row R3 of transistor 540T through 534T and their respective resistors 540TT through 534RR, moving from left (i.e., from node 506 and column C0) to right. At the right end of that row R3 are resistor 534RR and its respective transistor 534T coupled to column C3, but continuing in the series path of resistors, the next resistor 532RR in series is not at the left (i.e., column C0) end of the next row R2, but instead is at the right end of that next row R2 and the transistor 532T connected to that next resistor 532RR is again connected to selectively output to column C3, that is, the same column to which the preceding resistor 534RR may be connected. Indeed, continuing then from column C3 to the right and hen left along row R2, this same serpentine pattern repeats at the left end of row R2, which ends with resistor 526RR being switchably connected to column C0 through respective transistor 526T, after which in series is resistor 524RR which is in the next row R1, but at the left end and with a respective transistor 524TT for switchably connecting resistor 524RR to the same column C0, and so forth also for the far right end of row R1. Given these connections, the decoding table of serpentine decoder 502 is constructed to match the serpentine connectivity, so that an increase in the binary sequence of bits dac_bin<1:0> is properly mapped from a column at one end of a row to the same column for the next successive row; moreover, to accomplish such an operation, note further that in addition the two LSBs dac_bin<1:0> connected to decoder 502, so also is the next more significant bit dac_bin<2>, so as to enable the decoding shown in the following Table 7:

TABLE 7

| bit dac_bin<2> | LSBs dac_bin<1:0> | Column enabled |
|---|---|---|
| 0 | 00 | C0 |
| 0 | 01 | C1 |
| 0 | 10 | C2 |
| 0 | 11 | C3 |
| 1 | 00 | C3 |
| 1 | 01 | C2 |
| 1 | 10 | C1 |
| 1 | 11 | C0 |

Table 7 thus illustrates the enabled column follows the serpentine nature of the resistor string, for example as the LSBs dac_bin<2:0> increase from 000 to 111, with the serpentine effect occurring in the transition of dac_bin<2:0>=011 to dac_bin<2:0>=100, as both cases result in a selection of column C3. Moreover, note that Table 7 also applies when dac_bin<3> also transitions; for example, in the transition of dac_bin<3:0>=0111 to dac_bin<3:0>=1000, note that per Table 7 both bit sets of bits causes column C0 to be enabled, again preserving the serpentine nature of column addressing so as to match the serpentine construction of the row/column/resistor/transistor layout of stage 500. Indeed, it is contemplated in connection with a preferred embodiment that by accessing a same column twice during a ramping up or down of dac_bin in this manner that a lower glitch rate and/or magnitude will be achieved as opposed to other approaches.

Also contemplated in connection with stage 500 of FIG. 5 are various alternatives. For example, while FIG. 5 illustrates a 16-bit voltage divider, other variations, such as powers of 2, may be implemented in alternative preferred embodiments. Indeed, for N>16, such an approach may be favorable over stage 400 of FIG. 4A, as the latter will increase capacitance by increasing N therein. To achieve more bits with stage 500, than if N has an integer square root, then such an approach, like that in FIG. 5, will preferably implemented with $\sqrt{N}$ rows and $\sqrt{N}$ columns; however, if N does not have an integer square root, then such an approach still may implement the serpentine nature of the resistor divider illustrated in FIG. 5, but with a number of rows differing from the number of columns.

Figure 6:
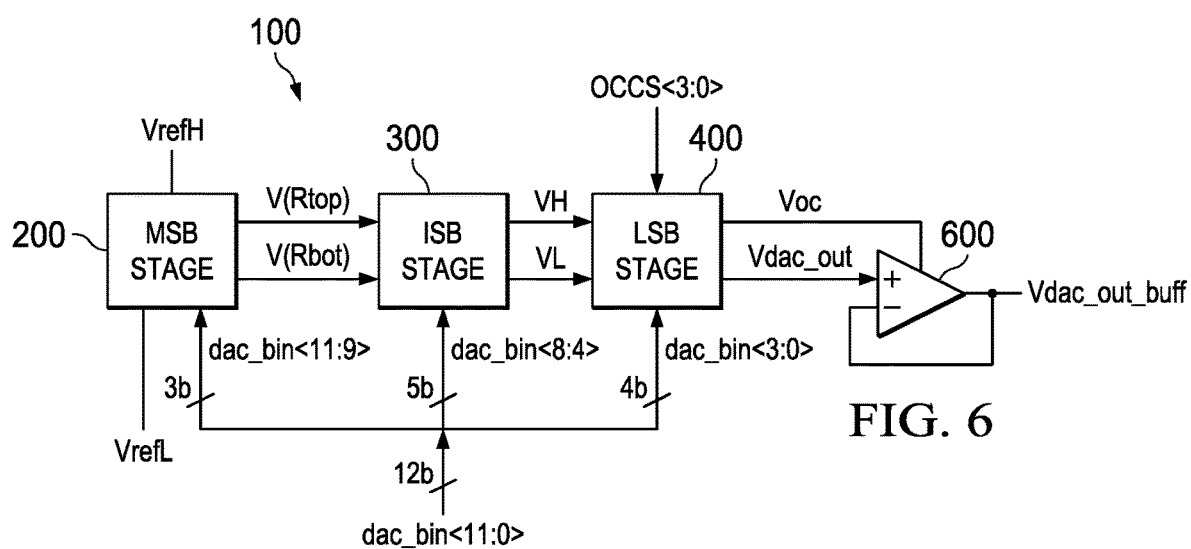
FIG. 6 illustrates the DAC system of FIG. 1 with an additional output buffer and an offset cancellation circuit incorporated into the LSB stage.

FIG. 6 again illustrates DAC system 100 of FIG. 1, and adds to it additional aspects. In FIG. 6, the system 100 analog output of Vdac_out is coupled to a buffer 600, which may be constructed as an amplifier in a negative feedback configuration. In this regard, the output of buffer 600 provides a corresponding analog signal output, Vdac_out_buff, and the signal output is fed back to the inverting input of buffer 600, while Vdac_out is connected to the non-inverting input of buffer 600.

In another preferred aspect, note that buffer 600 may experience some level of DC offset, as is known in certain technologies. In the present context, note further that the offset may exceed the resolution obtained by the three stages of system 100. For example, consider the instance where VrefH=3.0V and VrefL is ground, and recall that stages 200, 300, and 400 together provide a 16 bit DAC. Thus, the DAC provides $2^{16}$=4,096 different voltage divisions of the differential voltage input 3.0V, so the resolution obtainable is 3.0V/4096=0.732 millivolts. However, a device such as buffer 600 may have a DC offset in the range of ±3 millivolts, for a total swing of 6 millivolts. In other words, the DC offset is approximately 8 times larger than the resolution obtainable by stages 200, 300, and 400, so that obtainable resolution can be overlaid with considerable error introduced by the 6 millivolt swing in the buffer DC offset. Further in this regard, therefore, one preferred embodiment further augments LSB stage 400, or a portion thereof, so that LSB stage 400 provides both the already-described output Vdac_out, but in addition provides a voltage offset cancellation signal, Voc, coupled to an offset control input of buffer 600 so as to correct (i.e., adjust so as to reduce) the DC offset within the achievable resolution for the DAC, as further described below. Further in this regard, FIG. 6 also illustrates an offset cancellation control signal OCCS is shown, with four bits (i.e., OCCS<3:0>), as an input to LSB stage 400 and so as to facilitate the offset cancellation. The OCCS bits may come from a separate circuit, such as the processor or controller of which DAC 100 serves or is a part of, and where that signal may be established during manufacture, start-up or the like, and then stored in memory for later DC offsetting of buffer 600.

Figure 7:
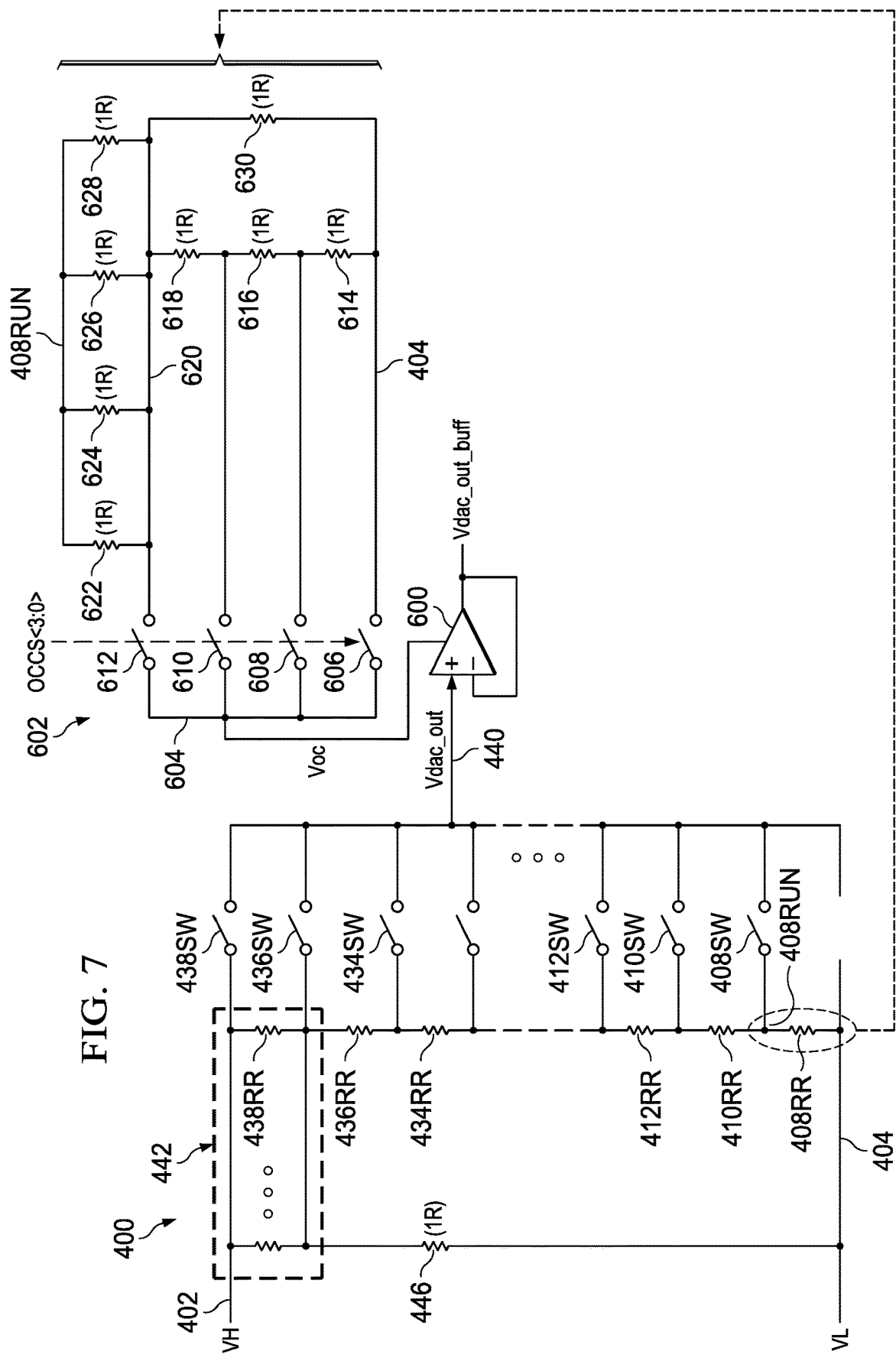
FIG. 7 illustrates a schematic representation of a first offset cancellation circuit incorporated into the LSB stage.

FIG. 7 illustrates a schematic representation of offset cancellation circuit 602, which as introduced above with respect to FIG. 6 is, in a preferred embodiment, incorporated into LSB stage 400. Continuing with the example of the preceding paragraph, in which the buffer DC offset is approximately 8 times the resolution achievable by the ADC, then the same swing of 8 times that resolution can be achieved from using the voltage across 8 of the series-string resistors therein because the voltage across any one of those resistors represents the lowest resolution of the DAC, so across 8 of those resistors is approximately the same voltage as the DC offset swing of buffer 600. Moreover, according to a preferred embodiment, the voltage across each of those resistors is preferably further subdivided into a number of equal steps so as to provide additional resolution or granularity for tuning the offset of buffer 600 by way of Voc. In the example of FIG. 7, therefore, such additional resolution is four parts per series-string resistor, that is, circuit 602 provides a so-called ¼ step divider, meaning that the circuit is configured and operable to divide its differential rail voltage into ¼ steps (e.g., 0, ¼, 2/4, ¾), as further understood below.

Looking in more detail at the FIG. 7, offset cancellation circuit 602 preferably replaces the lowest resistor 408RR in stage 400 with a ¼ step circuit output for use as a voltage offset cancellation Voc from a node 604, while still also providing a switchable voltage from an output node 408RUN to node 440. By replacing only a single resistor (e.g., resistor 408RR) with a ¼ step circuit, such an implementation provide only the ¼ step for the voltage swing across resistor 408RR (i.e., (VH−VL)/4096). Thus, if additional voltage swing selection is desired for offset cancellation, a number of additional resistors in the series string containing resistors 408RR through 438RR may be likewise replaced with a circuit of the configuration of circuit 602.

Looking then at circuit 602 in more detail, the circuit is shown between nodes 408RUN and 404, which note in the condensed illustration of FIG. 7 of stage 400 are the nodes at the upper and lower terminals, respectively, of resistor 408RR. Moreover, the offset cancellation control signal OCCS from FIG. 6 is shown in more detail, with four bits (i.e., OCCS<3:0>), with each of the four bits to control a respective one of four switches 606, 608, 610, and 612 in circuit 602. Each bit in OCCS<3:0>, if enabled, selectively closes a respective one of the four switches 606, 608, 610, and 612 at a time, so as to provide a selected voltage to an output node 604 from the other terminal of the closed switch, and thereby providing the offset voltage Voc to buffer 600. Particularly, each of switches 604, 606, and 608 has a first terminal connected to output node 604 and a second terminal connected to a first terminal of a respective one of evenly-numbered 1R unit resistance resistors 614 through 618; in addition, switch 612 has a first terminal connected to output node 604 and a second terminal connected to a node 620, where there are four unit 1R resistors 622, 624, 626, and 628 connected in parallel between that node 620 and node 408RUN. Lastly, an additional resistor 630, having a single unit resistance 1R, is connected between node 620 and node 404.

Given the preceding, the reader should comprehend various similarities of the structure of circuit 602 to others set forth above and the equivalent resistances achievable by selecting closure of any one of switches 606, 608, 610, and 612. In general, therefore: (i) the four parallel resistors 622, 624, 626, and 628 provide an equivalent resistance of (R/4); and (ii) the parallel connection of resistor 630 to the series connected resistors 614, 616, and 618 provide an equivalent resistance of (3R/4)—thus, items (i) and (ii) contribute in series to divide ¾ of the voltage between nodes 408RUN evenly between nodes 620 and 404, so that: (A) node 404 voltage is selectable by switch 606; (B) ¼ of the voltage between nodes 404 and 408RUN is selectable by switch 608; (C) 2/4 of the voltage between nodes 404 and 408RUN is selectable by switch 610; and (D) ¾ of the voltage between nodes 404 and 408RUN is selectable by switch 612. Moreover, as introduced above, OCCS<3:0> may be determined earlier and stored to select one of such switches, again providing a resolution of (¼)*(1/4096)*(VH−VL) and thus also the switchable selection for Voc as any one of VL, (¼)*(1/4096)*(VH−VL), (2/4)*(1/4096)*(VH−VL), or (¾)*(1/4096)*(VH−VL). Moreover, one skilled in the art also should now appreciate that, as introduced above, other resistors in the series-string of stage 400 may likewise be replaced with a comparable structure to circuit 602, in which additional increments of this resolution (e.g., (4/4)*(1/4096)*(VH−VL), (5/4)*(1/4096)*(VH−VL), and so forth) may be provided. In addition, while the above example illustrates a ¼ step, various design considerations or the like may give rise to a different step size, in which case circuit 602 is readily modified given the teachings of this document to provide more or less resistors in the series string and in the parallel combination connected to the top node (or, could be bottom node), so as to achieve the different desired step size.

Figure 8:
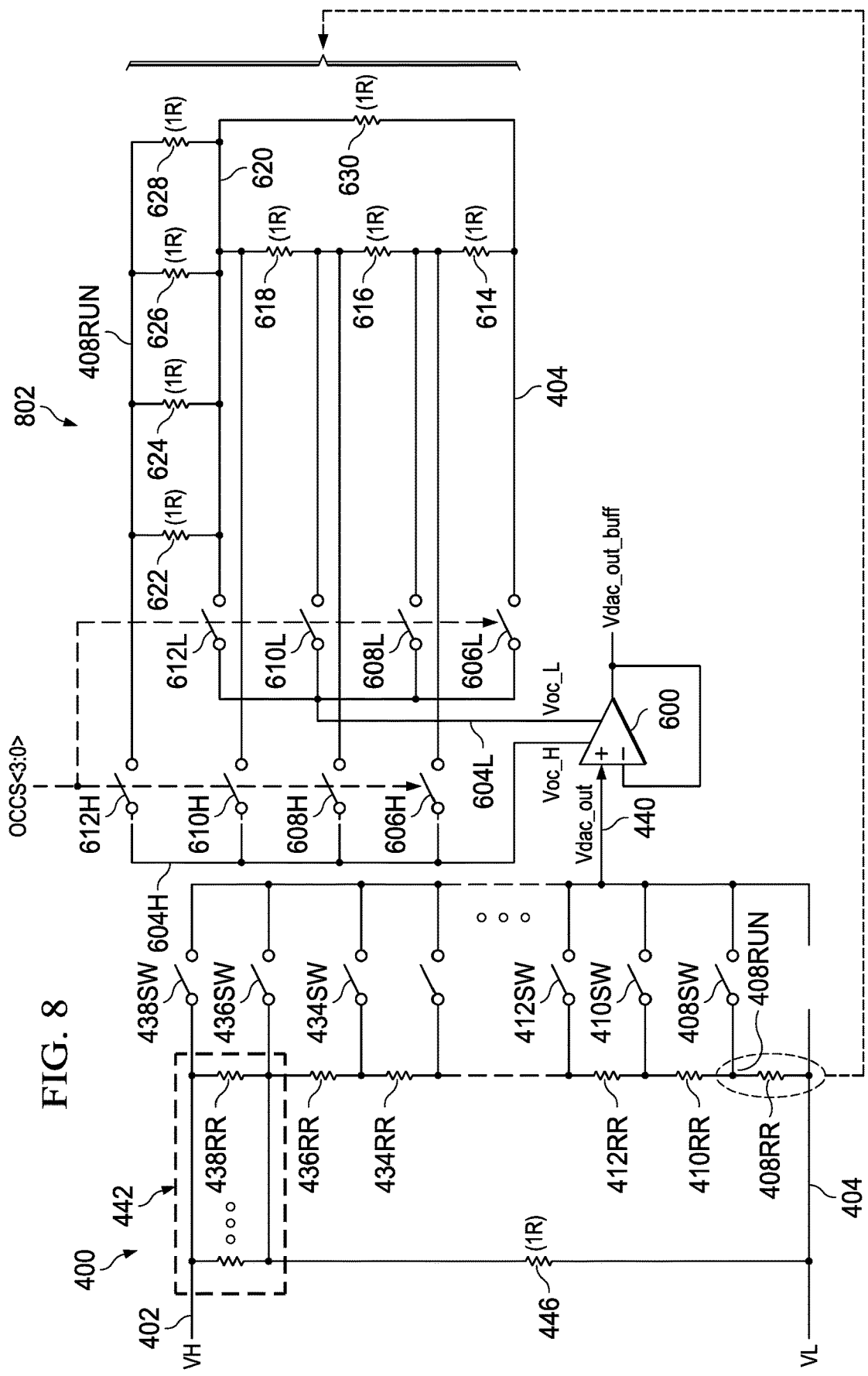
FIG. 8 illustrates a schematic representation of a second, alternative, offset cancellation circuit incorporated into the LSB stage.

FIG. 8 illustrates a schematic representation of an alternative preferred embodiment offset cancellation circuit 802, which, as introduced above with respect to FIG. 6 and similar to circuit 602 of FIG. 7, is alternatively incorporated into LSB stage 400. Specifically, as known in the art, some buffer/amplifier circuits permit a DC offset adjustment by way of a differential input and interpolation between those inputs, for example by including a number (e.g., 16) of differential transistor pairs responsive to the differential input. An example of such an approach may be found in U.S. Pat. No. 6,707,404, issued on Mar. 16, 2004, to Yilmaz, and co-owned by the assignee of the present patent application, and hereby incorporated herein by reference. In this regard, therefore, circuit 802 of FIG. 8 provides a modification to circuit 602 of FIG. 7, where the modification provides a differential output voltage signal pair including Voc_H and Voc_L, where that pair is connected to buffer 600 for DC offset cancellation from interpolation that may be incorporated into buffer 600 per the above.

Looking in more detail to circuit 802, it includes the same connections and generally the same designations as circuit 602, with the distinction that the letter "L" is added to one set of switches so as to designate switches 606L, 608L, 610L, and 612L, all having a first terminal connected to a node 604L, where all of these items are shown in FIG. 7 as are the same connections, but without the "L" designation. Thus, in FIG. 7, these items provide the singular output Voc, whereas in FIG. 8 they provide one of the two differential signals, namely, Voc_L. In addition, however, an additional four switches 606H, 608H, 610H, and 612H, are also included, each with a first terminal connected to a first node 604H that provides the second one of the two differential signals, namely, Voc_H; further, the second terminal of each of these four switches 606H, 608H, 610H, and 612H is connected to a respective higher potential across each respective resistor, that is: (i) the second terminal of switch 606H is connected to a terminal of resistor 614 that is opposite the resistor 614 terminal that is connected to switch 606L; (ii) the second terminal of switch 608H is connected to a terminal of resistor 616 that is opposite the resistor 616 terminal that is connected to switch 608L; (iii) the second terminal of switch 610H is connected to a terminal of resistor 618 that is opposite the resistor 618 terminal that is connected to switch 610L; and (iv) the second terminal of switch 612H is connected to a terminal of the parallel resistance of resistors evenly-numbered 622 through 628 that is opposite the terminal of that parallel resistance that is connected to switch 612L.

Given the preceding, the operation of circuit 802 should be readily ascertainable from the illustrations and descriptions of FIGS. 6 and 7, as well as the comparable teachings of earlier preferred embodiments. For circuit 802, when OCCS<3:0> specifies one of four switches, the intended illustration in FIG. 8 is that two switches close, each with the same first three digit reference number. For example, if OCCS<3:0>=0000, then switch 606L and 606H both close, with switch 606L thereby connecting node 404 to node 606L and providing a first voltage as Voc_L and switch 606H thereby connecting the potential between resistors 614 and 616 to node 604H and providing a second voltage as Voc_H, with those two output voltages providing a differential DC offset correction input to buffer 600. Moreover, the resistor dividing teachings of this document will therefore readily facilitate an understanding to one skilled in the art of the various voltage divisions thereby switchably selectable for outputting, in the context of DC offset correction.

Figure 9:
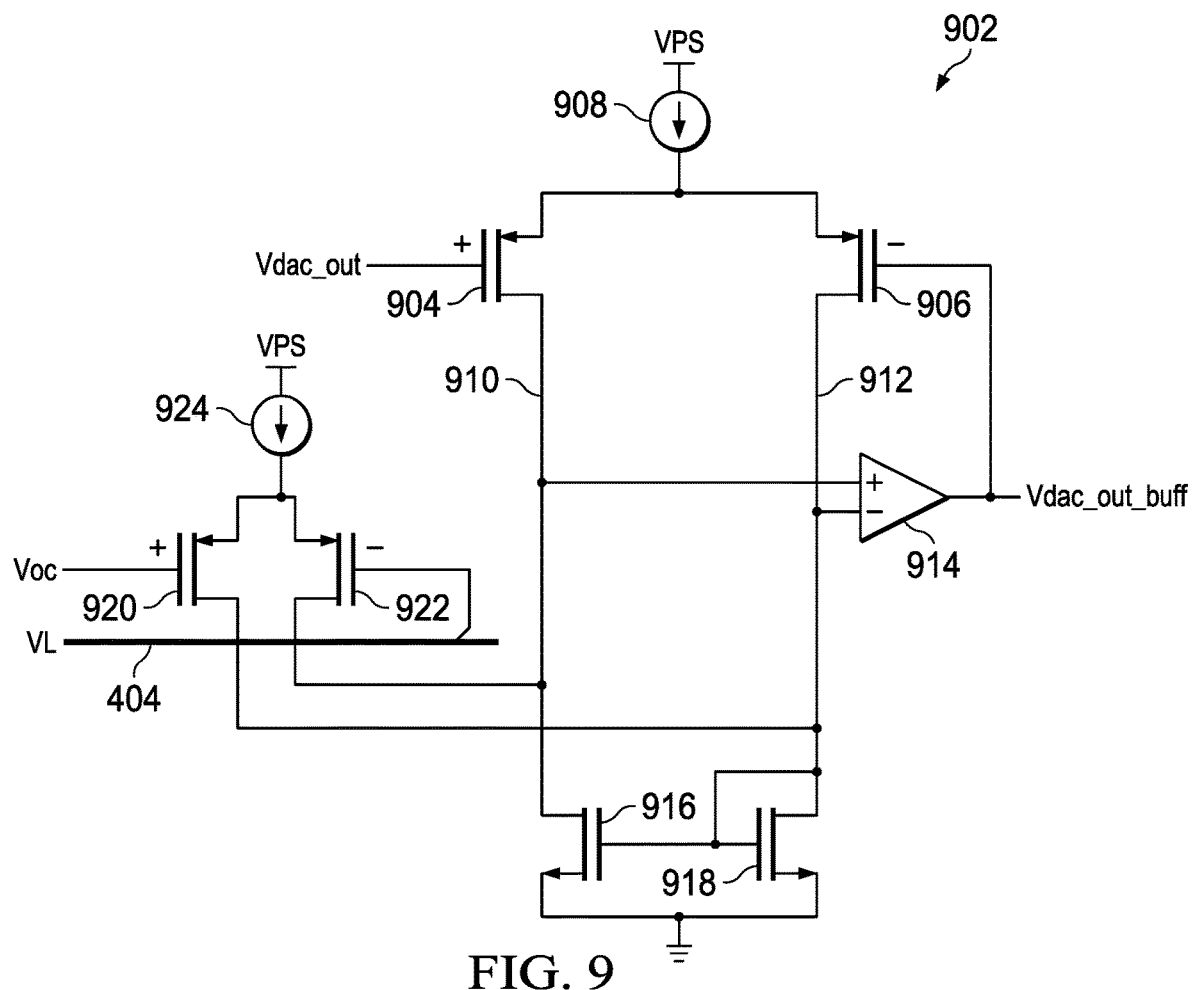
FIG. 9 illustrates a preferred embodiment offset cancellation circuit for implementing offset cancellation using the Voc signal from FIG. 7.

FIG. 9 illustrates a preferred embodiment offset cancellation circuit 902 for implementing offset cancellation in buffer 600 using the Voc signal from FIG. 7. Circuit 902 includes a first differential PMOS transistor pair including PMOS transistor 904 and PMOS transistor 906, each having a source connected to an output of a first current source 908 that receives a power supply voltage (e.g., the supply to the entire DAC 100) VPS. The gate of PMOS transistor 904 receives the Vdac_out signal from FIG. 7 (i.e., from node 440). The drain of PMOS transistor 904 is connected to a node 910, and the drain of PMOS transistor 906 is connected to a node 912. Node 910 is also connected to a non-inverting input of an amplifier 914 and to a drain of an NMOS transistor 916, which has its source connected to ground.

Node 912 is also connected to an inverting input of amplifier 914 and to a drain of an NMOS transistor 918, which has its source connected to ground, and node 912 is also connected to the gates of both of NMOS transistors 916 and 918. Circuit 902 also includes a second differential PMOS transistor pair including a PMOS transistor 920 and a PMOS transistor 922, each having a source connected a current source 924 that is connected to receive the voltage VPS. The drain of PMOS transistor 920 is connected to node 912 and the drain of PMOS transistor 922 is connected to node 910. The gate of PMOS transistor 920 is connected to receive the Voc signal from FIG. 7, and the gate of PMOS transistor 922 is connected to node 404 from FIG. 7, which recall is also connected to the lower rail voltage VL.

The operation of circuit 902 is now described. First, note that the output signal Vdac_out_buff of amplifier 914 represents the buffered/amplified/converted output from the three stages of system 100, with the further offset cancellation provided by circuit 902. Thus, Vdac_out_buff includes any offset voltage that is introduced by the buffer/amplifier, but is also reduced (preferably toward zero) by an offset cancellation voltage controlled by Voc. Further in this regard, therefore, note that the difference between Voc and VL, as applied to the gates of PMOS pair 920 and 922, provides a first differential signal or current to nodes 910 and 912, and then the feedback connection from the output of amplifier 914, as provided to the gate of PMOS transistor 906, and as a differential from Vdac_out applied to the gate of PMOS transistor 904, further adjusts the differential signals on nodes 910 and 912. Hence, the feedback operates toward offsetting the DC offset of the amplifier, as stated above.

Figure 10:
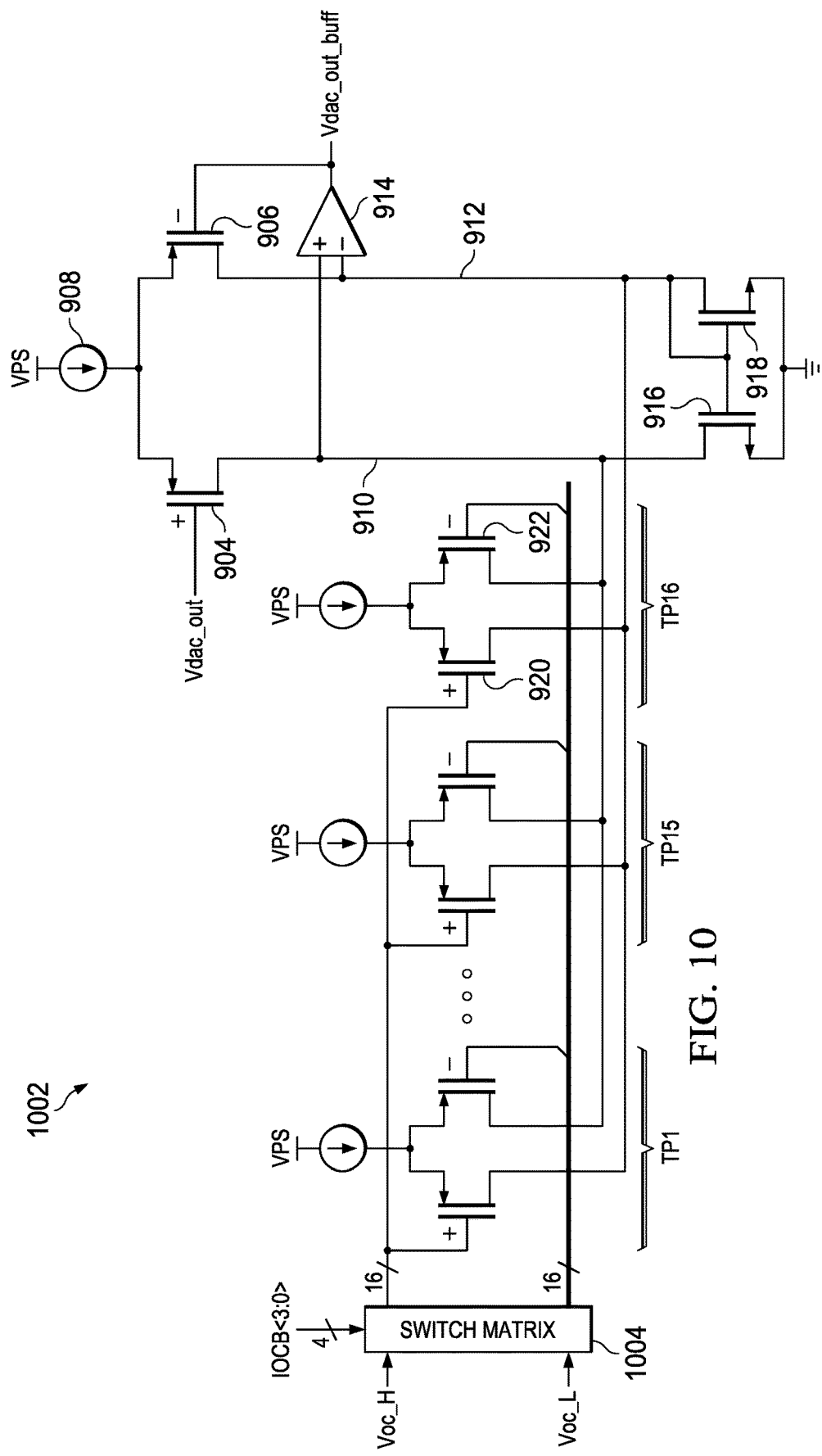
FIG. 10 illustrates a preferred embodiment offset cancellation circuit for implementing offset cancellation using the differential Voc_H and Voc_L signals from FIG. 8.

FIG. 10 illustrates a preferred embodiment offset cancellation circuit 1002 for implementing offset cancellation in buffer 600 using the differential Voc_H and Voc_L signals from FIG. 8. Various of the components and connections in circuit 1002 are the same as circuit 902 in FIG. 9, so the reader is assumed familiar with those aspects. In addition, circuit 1002 includes a switch matrix 1004, which receives a number B of interpolation offset cancellation bits IOCB, where in the example illustrated B=4 and such bits are accordingly shown as IOCB<3:0>. Also input to switch matrix 1004 are the differential Voc_H and Voc_L signals from offset cancellation circuit 802 of FIG. 8. Switch matrix 1004 is connected to output these signals to the respective gates of $2^B$ PMOS transistor pairs, so for the example illustrated there are a total of $2^B=2^4=16$ PMOS transistor pairs TP1, . . . , TP15, TP16, where such pairs include the PMOS pair 920 and 922 indicated as pair TP16. Each of these PMOS transistor pairs is configured in a manner comparable to PMOS pair 920 and 922, that is, with sources of the pair connected to a respective current source, a drain of the pair transistor that is connected to switchably receive Voc_H at its gate connected to node 912, and a drain of the pair transistor that is connected to switchably receive Voc_L at its gate connected to node 910.

The operation of circuit 1002 is comparable to that of circuit 902, with the additional operability to linearly interpolate between Voc_H and Voc_L in response to the IOCB<3:0> bits, which select a number of transistor pairs to provide voltage to nodes 910 and 912. Specifically, the number of PMOS transistor pairs having an input connected to Voc_H at a time is equal to the decimal value of the IOCB<3:0> bits that are applied to switch matrix 1004. For example, if the IOCB<3:0> bits are equal to zero, all of the (+) inputs of PMOS transistor pairs TP1 through TP16 are connected to Voc_L, and the output Vdac_out_buff of amplifier 914 will then be equal to Voc_L. If the digital input IOCB<3:0> bits are equal to 0001, then the (+) input of one of the PMOS transistor pairs TP1 through TP16 is connected to Voc_H, while the other (+) inputs are connected to Voc_L. Since one of 16 of the (+) inputs is connected to Voc_H, that PMOS transistor pair adds an offset cancellation voltage of (1)(Voc_H−Voc_L)/16 to amplifier 914. Similarly, with each increase of the digital input IOCB<3:0> bits, there is an increase in the numerator multiplier for the generated offset voltage so, for example, if IOCB<3:0>=0010 (i.e., decimal value of 2), then Voc_H is connected to the (+) gate input of a corresponding two pairs of PMOS transistors, in which case collectively those two pairs add an offset cancellation voltage of (2)(Voc_H−Voc_L)/16 to buffer 914. A another example, if IOCB<3:0>=0011 (i.e., decimal value of 3), then Voc_H is connected to the (+) gate input of a corresponding three pairs of PMOS transistors, in which case collectively those three pairs add an offset cancellation voltage of (3)(Voc_H−Voc_L)/16 to buffer 914. Hence, in general, the amount of offset voltage may be represented as in the following Equation 3:

$$\text{offset cancellation voltage} = \frac{\text{decimal value}(IOCB\langle 3:0 \rangle) * (\text{Voc\_H} - VocL)}{16} \quad \text{Equation 3}$$

Accordingly, circuit 1002 provides an additional level of interpolation for purposes of offsetting DC offset of buffer 914.

From the above, various preferred embodiments provide circuits and a system that includes a digital to analog conversion with two or more stages having varying resistor/switching configurations. Further, the preferred embodiments have been shown to have numerous benefits, and various embodiments have been provided. For example, preferred embodiments may be implemented based, for example, on unit resistance with resistance values considerably lower than traditional ladder only networks. Further, preferred embodiments may produce improved performance in terms of speed and reduced output glitches. As still another benefit, various modifications have been described and others may be contemplated or discernable by one skilled in the art, such as differing partitions the numbers of digital bits in a total digital number to different stages of the converter, and differing step sizes of resistor configurations described herein. Accordingly, while various alternatives have been provided according to the disclosed embodiments, still others are contemplated and yet others may be ascertained. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:
1. A circuit comprising:
a circuit stage comprising:
a first voltage input;
a second voltage input;
a set of resistors coupled in series between the first voltage input and the second voltage input;
a voltage output; and
a voltage offset output; and a buffer comprising:
   a first input coupled to the voltage output of the circuit stage;
   a second input coupled to the voltage offset output of the circuit stage; and
   a third input coupled to an output of the buffer.

2. The circuit of claim 1, wherein the circuit stage further comprises a set of switches coupled between the set of resistors and the voltage output.

3. The circuit of claim 1, wherein the set of resistors is a first set of resistors, and the circuit stage further comprises a second set of resistors coupled in parallel with the first set of resistors.

4. The circuit of claim 1, wherein the circuit stage comprises an offset circuit.

5. The circuit of claim 4, wherein the offset circuit comprises:
   a node coupled to the voltage offset output;
   a set of switches coupled to the node; and
   a first set of resistors coupled together in series and coupled to the set of switches.

6. The circuit of claim 5, wherein the offset circuit further comprises:
   a second set of resistors coupled together in parallel and coupled to a switch of the set of switches.

7. A circuit device comprising:
   a first set of inputs configured to receive a reference voltage;
   a second set of inputs configured to receive a digital value;
   an output configured to provide an analog voltage in response to the reference voltage and the digital value;
   a set of stages coupled in series between the first set of inputs and the output, wherein the set of stages includes a first stage that includes:
      a first voltage input;
      a second voltage input;
      a set of resistors coupled in series between the first voltage input and the second voltage input;
      a voltage output; and
      a voltage offset output; and
   a buffer comprising:
      a first input coupled to the voltage output of the first stage;
      a second input coupled to the voltage offset output of the first stage; and
      a third input coupled to an output of the buffer.

8. The circuit device of claim 7, the first stage further comprises a set of switches coupled between the set of resistors and the voltage output.

9. The circuit device of claim 7, wherein the set of resistors is a first set of resistors, and the first stage further comprises a second set of resistors coupled in parallel with the first set of resistors.

10. The circuit device of claim 7, wherein the first stage further comprises an offset circuit.

11. The circuit device of claim 10, wherein the offset circuit comprises:
   a node coupled to the voltage offset output;
   a set of switches coupled to the node; and
   a first set of resistors coupled together in series and coupled to the set of switches.

12. The circuit device of claim 11, the offset circuit further comprises:
   a second set of resistor coupled together in parallel and coupled to a switch of the set of switches.

13. The circuit device of claim 7, wherein the voltage offset output is a first voltage offset output, and the first stage further comprises a second voltage offset output coupled to the buffer and an offset circuit, the offset circuit comprising:
   a first set of switches coupled to the first voltage offset output; and
   a second set of switches coupled to the second voltage offset output.

14. The circuit device of claim 13, wherein the offset circuit comprises a first set of resistors coupled together in series and coupled to the first set of switches and to the second set of switches.

15. The circuit device of claim 14, wherein the offset circuit further comprises a second set of resistors coupled together in parallel and coupled to a first switch of the first set of switches and to a second switch of the second set of switches.

16. The circuit device of claim 7, wherein the first stage comprises an offset control signal input.

17. The circuit device of claim 7, wherein the buffer further comprises:
   a first transistor coupled to the voltage output of the first stage;
   a second transistor coupled to the voltage offset output of the first stage; and
   a third transistor coupled to the output of the buffer.

18. The circuit device of claim 7, wherein the voltage offset output is a first voltage offset output and the first stage further a second voltage offset output, and the buffer further comprises a switch matrix coupled to the first voltage offset output and the second voltage offset output.

19. The circuit device of claim 7, wherein the set of stages includes a second stage that includes:
   a first input;
   a second input;
   a first output coupled to the first voltage input of the first stage;
   a second output coupled to the second voltage input of the first stage; and
   a resistor ladder circuit.

20. The circuit device of claim 19, wherein:
the resistor ladder circuit includes a set of sub-stages; and
each sub-stage of the set of sub-stages includes:
   a first resistor coupled between a respective first node and a respective second node;
   a second resistor coupled between the respective second node and a respective third node; and
   a switch coupled to selectably couple:
      in a first switch position, the respective first node of the sub-stage to the respective second node of a preceding sub-stage and the respective third node of the sub-stage to the respective third node of the preceding sub-stage; and
      in a second switch position, the respective first node of the sub-stage to the respective third node of the preceding sub-stage and the respective third node of the sub-stage to the respective second node of the preceding sub-stage.

* * * * *